United States Patent
Sakai

(10) Patent No.: US 7,184,273 B2
(45) Date of Patent: Feb. 27, 2007

(54) ELECTRONIC DEVICE WITH PROTECTIVE HOUSING HAVING ENHANCED RIGIDITY

(75) Inventor: Naoki Sakai, Okazaki (JP)

(73) Assignee: Denso Corporation, Kariya (JP)

( * ) Notice: Subject to any disclaimer, the term of this patent is extended or adjusted under 35 U.S.C. 154(b) by 283 days.

(21) Appl. No.: 10/988,491

(22) Filed: Nov. 16, 2004

(65) Prior Publication Data

US 2005/0105253 A1 May 19, 2005

(30) Foreign Application Priority Data

Nov. 18, 2003 (JP) ............................. 2003-388334

(51) Int. Cl.
*H05K 7/10* (2006.01)
*H05K 7/06* (2006.01)

(52) U.S. Cl. .................. 361/752; 361/736; 361/728

(58) Field of Classification Search ............... 361/679, 361/728, 736, 752, 756, 741
See application file for complete search history.

(56) References Cited

U.S. PATENT DOCUMENTS

| | | | | |
|---|---|---|---|---|
| 5,364,280 A | * | 11/1994 | Colleran .................. | 439/76.1 |
| 5,392,197 A | * | 2/1995 | Cuntz et al. ............... | 361/818 |
| 5,473,109 A | * | 12/1995 | Plankl et al. .............. | 174/363 |
| 5,526,229 A | * | 6/1996 | Wakabayashi et al. ..... | 361/702 |
| 5,761,047 A | | 6/1998 | Settles et al. | |
| 6,341,063 B2 | * | 1/2002 | Kinoshita et al. .......... | 361/690 |
| 6,341,066 B1 | * | 1/2002 | Murowaki et al. ......... | 361/707 |
| 6,392,895 B2 | * | 5/2002 | Taguchi et al. ............ | 361/752 |
| 6,466,447 B2 | * | 10/2002 | Murowaki et al. ......... | 361/752 |
| 6,628,523 B2 | * | 9/2003 | Kobayashi et al. ......... | 361/736 |
| 6,707,678 B2 | * | 3/2004 | Kobayashi et al. ......... | 361/752 |
| 6,717,051 B2 | * | 4/2004 | Kobayashi et al. ......... | 174/535 |
| 6,752,638 B2 | * | 6/2004 | Na ............................ | 439/76.1 |
| 6,867,968 B2 | * | 3/2005 | Katsuro et al. ............. | 361/690 |
| 7,120,030 B2 | * | 10/2006 | Azumi et al. ............... | 361/752 |
| 2001/0017767 A1 | * | 8/2001 | Kitamura et al. ........... | 361/752 |
| 2002/0009905 A1 | * | 1/2002 | Poplawski et al. ......... | 439/76.1 |
| 2002/0039284 A1 | * | 4/2002 | Hsu .......................... | 361/737 |
| 2003/0087539 A1 | * | 5/2003 | Burmeister ................. | 439/78 |
| 2003/0112595 A1 | * | 6/2003 | Kwong et al. .............. | 361/685 |
| 2003/0117776 A1 | * | 6/2003 | Katsuro et al. ............. | 361/705 |
| 2003/0133273 A1 | * | 7/2003 | Nagaoka .................... | 361/752 |
| 2003/0156389 A1 | * | 8/2003 | Busse et al. ................ | 361/736 |
| 2003/0161117 A1 | * | 8/2003 | Barringer et al. .......... | 361/759 |

FOREIGN PATENT DOCUMENTS

| | | |
|---|---|---|
| JP | 2000-511352 | 8/2000 |
| JP | 2003-229678 | 8/2003 |
| JP | 2003-258454 | 9/2003 |
| JP | 2004186039 A * | 7/2004 |

* cited by examiner

*Primary Examiner*—Anatoly Vortman
(74) *Attorney, Agent, or Firm*—Posz Law Group, PLC

(57) ABSTRACT

An electronic device includes a printed circuit board, a housing in which the printed circuit board is accommodated, a cover covering an end opening of the housing, and a connector disposed on the printed circuit board which has an end exposed through an aperture of the cover outside the housing. The housing has an improved structure characterized by at least one protrusion formed on an inner face of a top wall of the housing, a bend in the top wall of the housing, and a table protruding outwardly from one wall of the housing on which a nameplate is attached. When the connector is rotated around a portion of the inner circumference of the cover defining the aperture, the at least one protrusion or the bend stops the rotation of the connector. The improved housing structure ensures a high rigidity of the housing and easy assembly of the electronic device.

26 Claims, 4 Drawing Sheets

ELECTRONIC DEVICE WITH PROTECTIVE HOUSING HAVING ENHANCED RIGIDITY

CROSS-REFERENCE TO RELATED APPLICATION

This application claims priority from Japanese Patent Application No. 2003-388334, filed on Nov. 18, 2003, the content of which is hereby incorporated by reference into this application.

BACKGROUND OF THE INVENTION

1. Technical Field of the Invention

The present invention relates generally to electronic devices with protective housings or cases. More particularly, the invention relates to an electronic device that includes a printed circuit board, a housing in which the printed circuit board is accommodated, a cover, and a connector. The housing has an improved structure that ensures a high rigidity of the housing and easy assembly of the electronic device.

2. Description of the Related Art

Japanese Unexamined Patent Publication No. 2003-229678 discloses an electronic device that has a housing accommodating a printed circuit board on which a connector is disposed.

The electronic device is an ECU (Electronic Control Unit) for an engine of an automotive vehicle. The ECU is shown in FIGS. 3A and 3B with a reference numeral 90 assigned thereto.

FIG. 3A is an exploded perspective view of the ECU 90. As shown in the figure, the ECU 90 includes a printed circuit board 1, a housing 2 designed to accommodate the printed circuit board 1, and a cover 3. The printed circuit board 1 has electronic components (not shown) mounted thereon. The housing 2, which is in a box-like shape, has an end opening 2h. The cover 3 has a flat-plate like shape with an aperture 3h formed therein. Both of the housing 2 and the cover 3 are fabricated from resin for weight saving. The ECU 90 further includes a connector 1c disposed on the printed circuit board 1 to connect the printed circuit board 1 with external devices or circuits. In addition, a nameplate 4 is attached on the upper wall of the housing 2.

FIG. 3B is a partially cross-sectional side view of the ECU 90. The cover 3 has, as shown in the figure, an outer periphery 3g thereof fit in the end opening 2h of the housing 2 to cover the end opening 2. A front end of the connector 3c is exposed through the aperture 3h of the cover 3 outside the housing 2, while a rear end of the same faces the end wall of the housing 2.

The ECU 90 has the deficiencies that are illustrated in FIGS. 4A, 4B, and 4C.

First, as shown in FIG. 4A, the resin-fabricated housing 2 may become deformed with the front end of the top wall thereof being flexed inwardly. In such a case, when the cover 3 is put into the end opening 2h of the housing 2 for assembly, an upper portion of the outer periphery 3g of the cover 3 will be obstructed by the front end of the top wall of the housing 2, so that the cover 3 can not be smoothly fitted into the end opening 2h.

Secondly, when an external mating connector is improperly plugged into or out from the connector 1c, an upward or downward unnecessary torque is, as shown in FIG. 4B, applied to the connector 1c. Such a torque causes stress on the printed circuit board 1, so that the printed circuit board 1 can become deformed, resulting in a circuit failure.

Finally, as shown in FIG. 4C, when the nameplate 4 is attached to one side wall of the housing 2, a stress in the direction of the outline arrow is applied to the side wall. Such a stress may cause the side wall to be flexed inwardly, so that the side wall depresses the electronic components mounted on the printed circuit board 1, resulting in a circuit failure.

SUMMARY OF THE INVENTION

It is, therefore, an object of the present invention to provide an electronic device which has a housing with an improved structure that ensures a high rigidity of the housing and easy assembly of the electronic device.

The electronic device includes a printed circuit board, a housing in which the printed circuit board is accommodated, a cover, and a connector.

The housing has a first opposite pair of a first and a second side wall and a second opposite pair of a third and a fourth side wall; the housing also has an end wall and an end opening opposite to the end wall.

The cover has an aperture formed therein; the cover also has at least a portion of an outer periphery thereof fit in the end opening of the housing to cover the end opening.

The connector is disposed on the printed circuit board. The connector has an opposite pair of a first side face facing the first side wall of the housing and a second side face abutting the printed circuit board; the connector also has another opposite pair of a first end exposed through the aperture of the cover outside the housing and a second end facing the end wall of the housing.

According to one aspect of the invention, the electronic device is further provided with at least one protrusion formed on an inner face of the first side wall of the housing to enhance a rigidity of the housing. The protrusion faces the first side face of the connector in a direction from the first side wall to the second side wall of the housing.

The protrusion is preferably so disposed that, when the connector is rotated around a portion of an inner circumference of the cover defining the aperture in a direction that the first end of the connector gets away from the first side wall of the housing, the protrusion makes contact with the connector, thereby stopping the rotation of the connector.

According to another aspect of the invention, the electronic device also includes a bend provided in the first side wall of the housing to enhance the rigidity of the housing. The bend has an inner face at least a part of which faces the second end of the connector in a direction from the end wall to the end opening of the housing.

The bend is preferably disposed such that, when the connector is rotated around a portion of the inner circumference of the cover defining the aperture in a direction that the first end of the connector gets closer to the first side wall of the housing, the bend makes contact with the connector, thereby stopping the rotation of the connector.

The protrusion and the bend in the first side wall of the housing prevent an end portion of the first side wall of the housing adjacent to the end opening from being flexed inwardly, thereby permitting easy fitting of the cover into the housing.

Further, when an unnecessary torque causes the connector to rotate around a portion of the inner circumference of the cover defining the aperture, the protrusion or the bend in the first side wall of the housing stops the rotation of the connector upon making contact therewith, thereby preventing the deformation of the printed circuit board and the resultant failure of the circuit.

According to yet another aspect of the invention, the electronic device is further provided with a table on which a plate is to be attached. The table protrudes outwardly from one of the first, second, third, and fourth side walls of the housing to enhance the rigidity of said housing.

The table prevents the side wall of the housing from which it protrudes from being inwardly flexed due to the stress caused when the plate is being attached to the table, thereby protecting the printed circuit board against the stress.

Accordingly, with the improved housing structure of the electronic device according to the invention, the rigidity of the housing is enhanced and the assembly of the electronic device is facilitated, overcoming all the deficiencies of the above-described prior art ECU 90.

BRIEF DESCRIPTION OF THE DRAWINGS

The present invention will be understood more fully from the detailed description given hereinafter and from the accompanying drawings of a preferred embodiment of the invention, which, however, should not be taken to limit the invention to the specific embodiment but are for the purpose of explanation and understanding only.

In the accompanying drawings.

DESCRIPTION OF THE PREFERRED EMBODIMENT

Figure 1A:
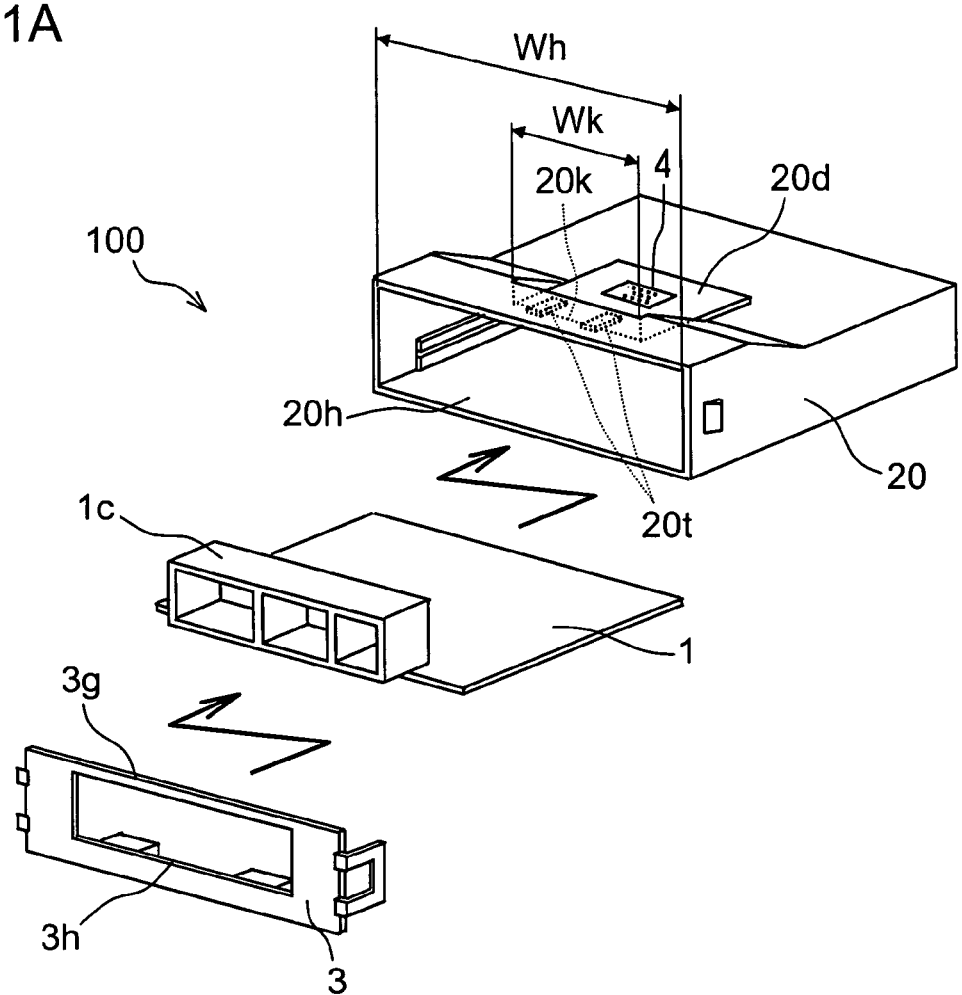
FIG. 1A is an exploded perspective view of an electronic device according to the preferred embodiment of the invention.

The electronic device according to the preferred embodiment of the present invention will be described hereinafter with reference to FIGS. 1A–1B.

The electronic device is an ECU for an engine of an automotive vehicle; the ECU is designated with a reference numeral 100 in the figures.

It should be noted that, for the sake of clarity and understanding, identical components having identical functions in the ECU 100 and the prior art ECU 90 described above have been marked, where possible, with the same reference numerals in each of the figures.

Referring first to FIG. 1A, the ECU 100 includes a printed circuit board 1, a housing 20 designed to accommodate the printed circuit board 1 therein, a cover 3, and a connector 1c.

The printed circuit board 1 has an upper face, on which electronic components (not shown) are mounted, and a lower face.

The housing 20 has, as shown in FIG. 1A, a box-like shape. The housing 20 has a top wall, a bottom wall, and a pair of side walls, all of which are disposed at substantially right angles to a rear end wall of the housing 20. The housing 20 has also a front end opening 20h opposite to the rear end wall thereof. The housing 20 is fabricated from resin for weight saving.

The cover 3 has a shape, for example, like a flat plate, with an aperture 3h formed therein. The cover 3 is also fabricated from resin for weight saving.

The connector 1c, which connects the printed circuit board 1 with external devices or circuits, is disposed on the upper face of the printed circuit board 1. The connector 1c has a bottom face abutting the upper face of the printed circuit board 1, and a top face opposite to the bottom face. The connector 1c has also a front end face, a rear end face, and a pair of side faces.

Figure 1B:
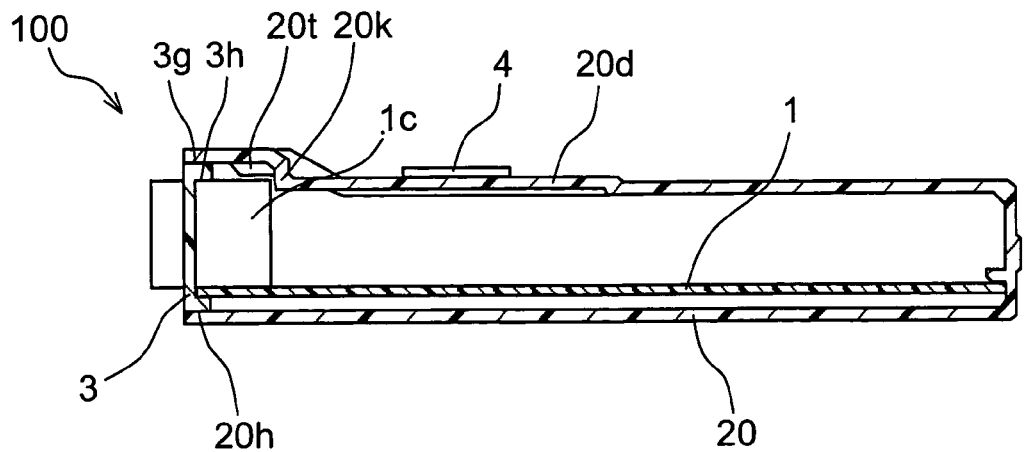
FIG. 1B is a partially cross-sectional side view of the electronic device of FIG. 1A.

Referring now to FIG. 1B, the cover 3 has an outer periphery 3g thereof fit in the end opening 20h of the housing 20 to cover the end opening 20h. The front end of the connector 1c is exposed through the aperture 3h of the cover 3 outside the housing 2, while the rear end of the same faces the end wall of the housing 2.

The printed circuit board 1, connector 1c, and cover 3 of the ECU 100 are identical to those of the prior art ECU 90. However, the housing 20 of the ECU 100 has a structure different from that of the housing 2 of the ECU 90.

In the housing 20 of the ECU 100, at least one protrusion 20t, for example two protrusions in FIG. 1A, is formed on a portion of the inner face of the top wall near the end opening 20h. The protrusion 20t has, as shown in FIG. 1B, a lower face facing the top face of the connector 1c. The protrusion 20t is preferably integral with the resin-fabricated housing 20, and preferably formed simultaneously with housing 20 using injection molding, or any other techniques known in the art.

Further, a bend 20k is provided in the top wall of the housing 20, the inner face of which partially faces the rear end of the connector 1c. The bend 20k in the top wall of the housing 20 has a width Wk smaller than a width Wh of the end opening 20h in the widthwise direction of the housing 20 defined by the pair of side walls thereof.

Furthermore, the top wall of the housing 20 has a table 20d on which a nameplate 4 is attached. The table 20d protrudes outwardly from the top wall of the housing 20. The table 20d is preferably formed using injection molding, or any other techniques known in the art.

The advantages of the ECU 100 resulting from the above-described features of the structure of the housing 20 will be described hereinafter with reference to FIGS. 2A–2C.

Figure 2A:
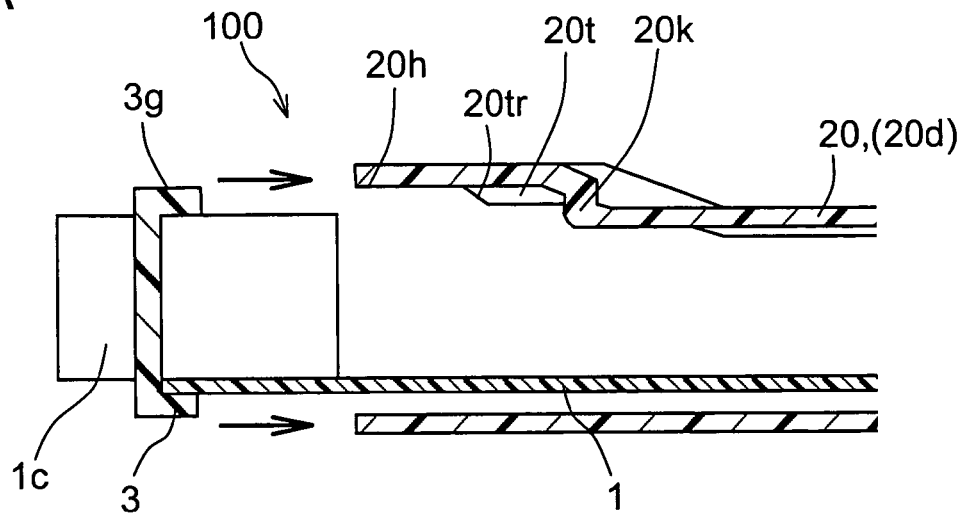
FIGS. 2A, 2B, and 2C are partially cross-sectional side views illustrating advantages of the electronic device of FIG. 1A.

First, in FIG. 2A, the protrusion 20t formed on the inner face of the top wall of the housing 20 enhances the rigidity of the front portion of the top wall which is to be disposed above the top face of the connector 1c.

Further, the bend 20k in the top wall of the housing 20, the inner face of which is substantially parallel to the end wall of the housing 20, also enhances the rigidity of the front portion of the top wall. As described above, the bend 20k in the top wall has the width Wk smaller than the width Wh of the end opening 20h. This renders the shape of the top wall of the housing 20 being more complicated in comparison with the case where the width Wk of the bend 20k is equal to the width Wh of the end opening 20h, thereby further increasing the rigidity of the front portion of the top wall.

As a result, the protrusion 20t and the bend 20k in the top wall of the housing 20 prevent the front end of the top wall of the housing 20 from being flexed inwardly, thereby permitting easy fitting of the cover 3 into the housing 20.

Secondly, the protrusion 20t has, as shown in FIG. 2A, a front end face 20tr facing the end opening 20h. The front end face 20*tr* of the protrusion 20*t* is inclined with respective to the inner face of the top wall of the housing 20 such that a distance between the front end face 20*tr* and the inner face of the top wall of the housing 20 increases gradually in the direction from the end opening 20*h* to the end wall of the housing 20.

In the case where the front end of the top wall of the housing 20 has been flexed inwardly, it will be gradually returned outwardly when the printed circuit board 1 is inserted into the housing 20 along the inclined front end face 20*tr* of the protrusion 20*t*. As a result, the flexed top wall of the housing 20 is restored, thereby providing sufficient insertion space for the cover 3.

Accordingly, the inclined front end face 20*tr* of the protrusion 20*t* facilitates the insertion of the cover 3 into housing 20, thereby permitting easy fitting of the cover 3 into the housing 20.

Additionally, the inclined front end face 20*tr* of the protrusion 20*t* may be either a beveled or a rounded one.

Figure 2B:
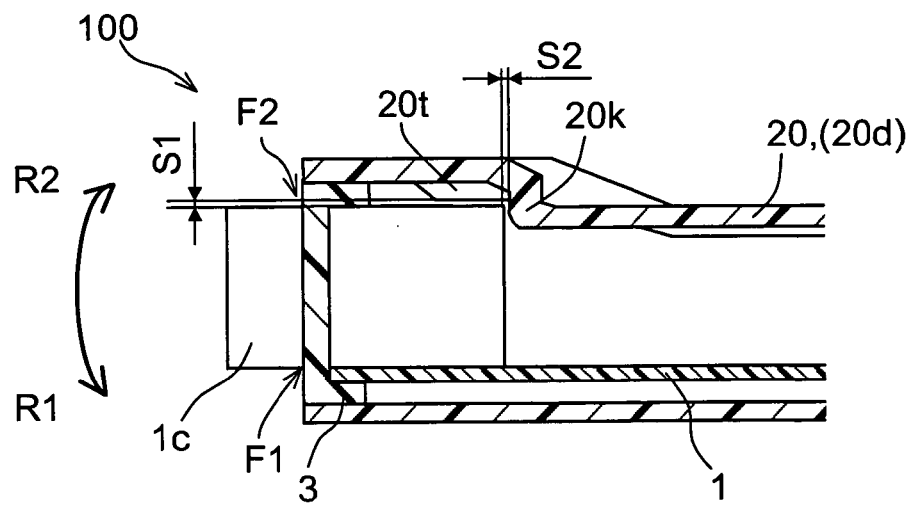

Thirdly, as shown in FIG. 2B, the protrusion 20*t* is so disposed that, when the front end of the connector 1*c* is rotated around the lower portion F1 of the inner circumference of the cover 3 defining the aperture 3*h* in the direction of R1 indicated by the bold arrow, the lower face of the protrusion 20*t* makes contact with the upper rear corner of the connector 1*c*. On the other hand, the bend 20*k* in the top wall of the housing 20 is disposed such that, when the front end of the connector 1*c* is rotated around the upper portion F2 of the inner circumference of the cover 3 defining the aperture 3*h* in the direction of R2, the inner face of the bend 20*k* makes contact with the upper rear corner of the connector 1*c*.

When an external mating connector is improperly plugged into or out from the connector 1*c* disposed on the printed circuit board 1, unnecessary torque will be applied to the connector 1*c*. The torque rotates the front end of the connector 1*c* around either the lower portion F1 or the upper potion F2 of the inner circumference of the cover 3 defining the aperture 3*h* in the direction of either R1 or R2.

Such unnecessary torque may deform, in the case of the prior art ECU 90, the resin-fabricated cover 3 so that an excessive stress is applied on the printed circuit board 1, resulting in a circuit failure.

On the contrary, in the case of the ECU 100 according to the present embodiment, either the protrusion 20*t* or the bend 20*k* in the top wall of the housing 20 stops the rotation of the connector 1*c* upon contacting the upper rear corner of the connector 1*c*. Thus, the further deformation of the resin-fabricated cover 3 will be accordingly stopped, thereby suppressing the stress applied on the printed circuit board 1. As a consequence, the deformation of the printed circuit board 1 and the resultant failure of the circuit is prevented.

Fourthly, as shown in FIG. 2B, a clearance S1 is provided between the lower face of the protrusion 20*t* and the top face of the connector 1*c*, while a clearance S2 is provided between the inner face of the bend 20*k* in the top wall of the housing 20 and the rear end face of the connector 1*c*.

Without the clearances S1 and S2, the fitting of the cover 3 into the housing 20 will become difficult. In addition, a noise will be easily generated from the interface between the protrusion 20*t* and the connector 1*c* and/or the interface between the bend 20*k* in the top wall of the housing 20 and the connector 1*c*, since the ECU 100 is used in an automotive vehicle which involves vibrations while running.

Accordingly, the clearances S1 and S2 in the ECU 100 facilitate the fitting of the cover 3 into the housing 20, and prevent such noises in circumstances involving vibrations.

Figure 2C:
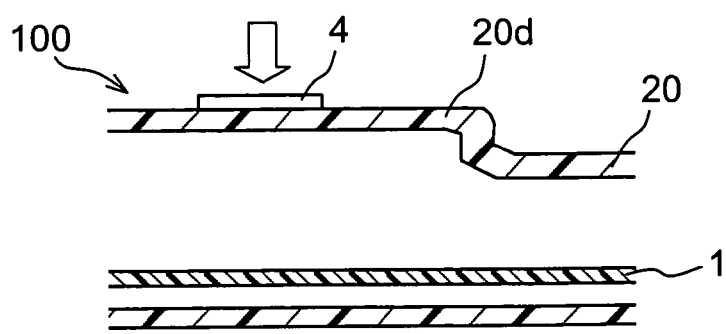
Figure 3A:
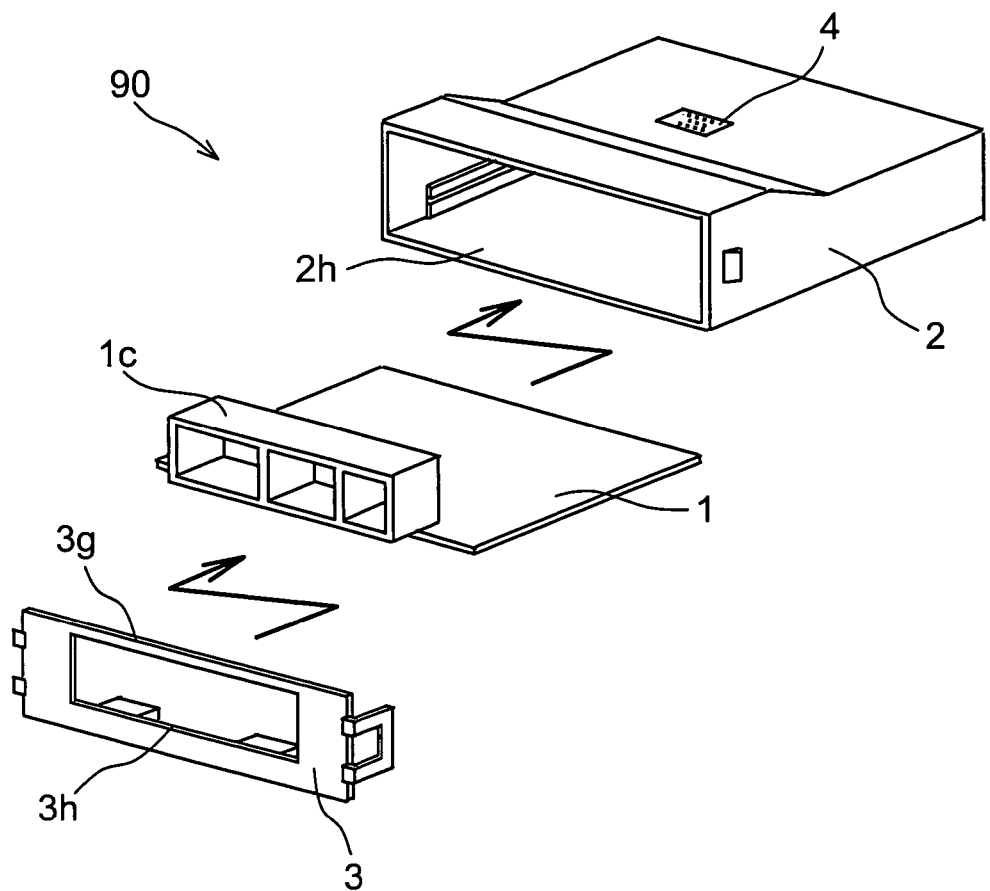
FIG. 3A is an exploded perspective view of a prior art electronic device.
Figure 3B:
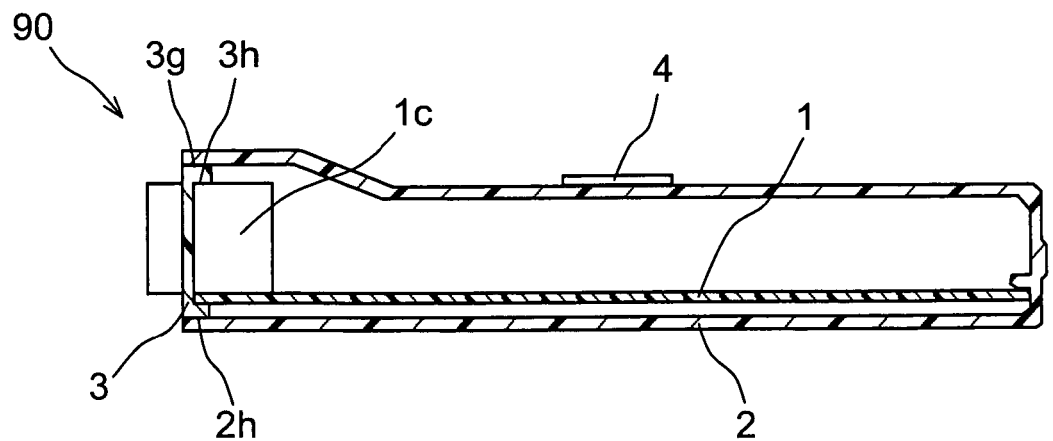
FIG. 3B is a partially cross-sectional side view of the electronic device of FIG. 3A.
Figure 4A:
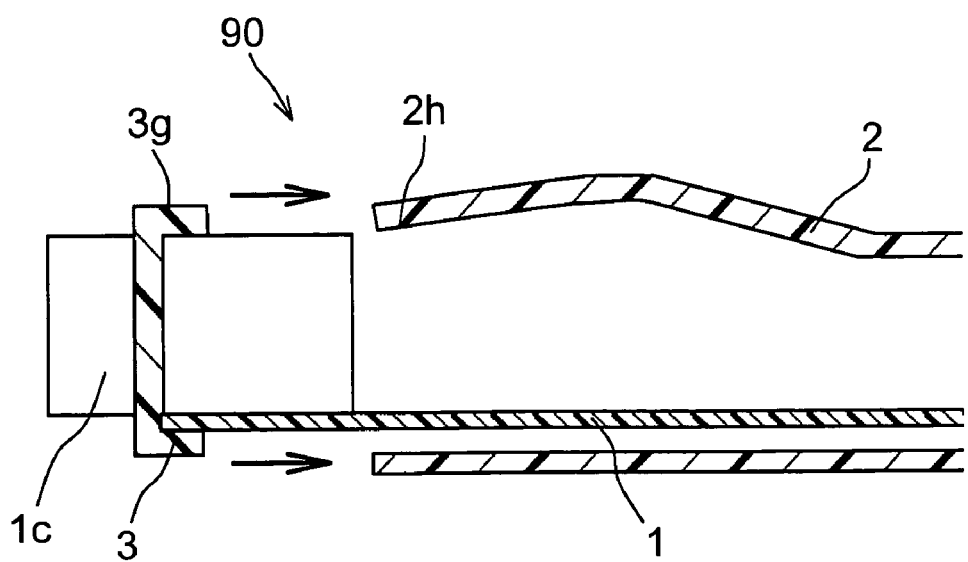
FIGS. 4A, 4B, and 4C are partially cross-sectional side views illustrating deficiencies of the prior art electronic device of FIG. 3A.
Figure 4B:
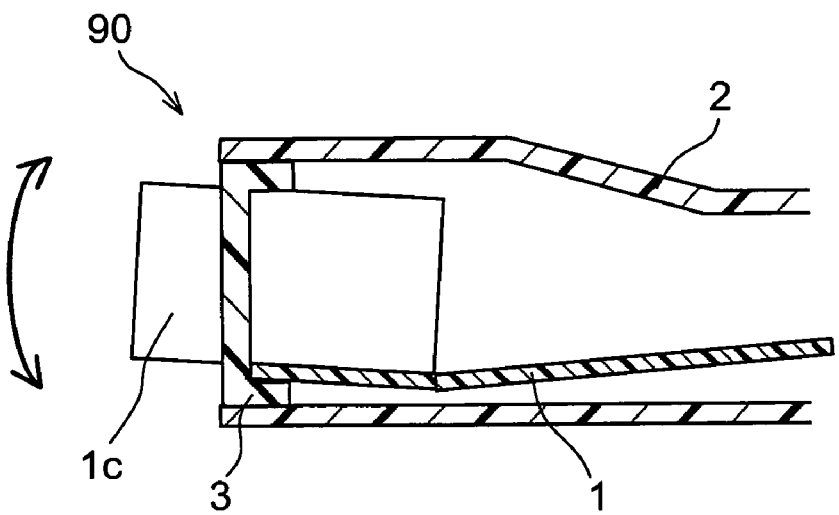
Figure 4C:
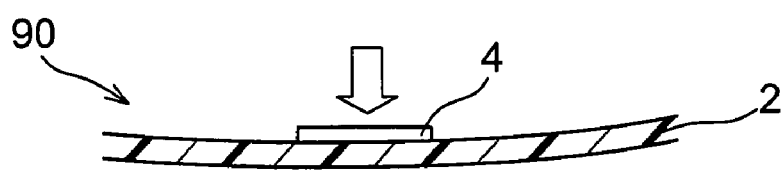
Figure 4C:
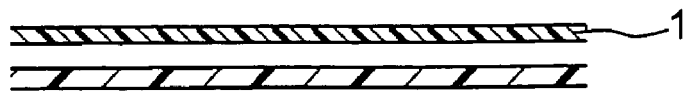

Finally, as shown in FIG. 2C, the nameplate 4 is attached on the table 20*d* of the top wall of the housing 20. The table 20*d* is so formed that it protrudes outwardly from the top wall of housing 20. Such formation of the table 20*d* enhances the rigidity of the top wall of the housing 20, thereby preventing the top wall from being inwardly flexed due to the stress caused when the nameplate 4 is being attached to the table 20*d*. Accordingly, the top wall of the housing 20 will not depress the electronic components mounted on the printed circuit board 1, thus preventing a failure of the circuit that could occur otherwise.

It should be noted that, in the case of the prior art ECU 90, the clearances between the inner face of the top wall of the housing 2 and the electronic components mounted on the printed circuit board 1 are required to be large enough; however, there is no such a requirement for the ECU 100 according to the present embodiment.

Additionally, the nameplate 4 is attached on the top wall of the housing 20 in the present embodiment; however, it may be attached on any other walls forming the housing 20. Accordingly, the table 20*d* may also be provided on any other walls forming the housing 20 so as to enhance the rigidity of the wall.

To sum up, the electronic device 100 according to the present embodiment includes the printed circuit board 1 carrying electronic components, the housing 20 in which the printed circuit board 1 is accommodated, the cover 3 covering the end opening 20*h* of the housing 20, and the connector 1*c* disposed on the printed circuit board 1.

The housing 20 has the improved structure characterized by the protrusion 20*t* formed on the inner face of the top wall of the housing 20, the bend 20*k* in the top wall of the housing 20, and the table 20*d* protruding outwardly from the top wall of the housing 20 on which the nameplate 4 is attached.

The improved housing structure ensures a high rigidity of the housing 20 and easy assembly of the electronic device 100.

While the above particular embodiment of the invention has been shown and described, it will be understood by those who practice the invention and those skilled in the art that various modifications, changes, and improvements may be made to the invention without departing from the spirit of the disclosed concept.

For example, in the previous embodiment, the housing 20 and the cover 3 of the electronic device 100 are fabricated from resin for weight saving.

However, the housing 20 and the cover 3 may also be fabricated from metal material, and the improved housing structure according to the invention is still able to enhance the rigidity of the metal housing 20 and permit easy assembly of the electronic device 100.

Moreover, the electronic device 100 is an ECU for an engine of an automotive vehicle in the previous embodiment; the ECU is generally required to be light and to have a rigidity sufficient to withstand vibrations occurring in the running of the vehicle.

However, the electronic device 100 may be any other electronic device for any possible use.

Such modifications, changes, and improvements within the skill of the art are intended to be covered by the appended claims.

What is claimed is:

1. An electronic device comprising:
   a printed circuit board;
   a housing in which said printed circuit board is accommodated, said housing having a first opposite pair of a first and a second side wall and a second opposite pair of a third and a fourth side wall, said housing also having an end wall and an end opening opposite to the end wall;

a cover having an aperture formed therein, said cover also having at least a portion of an outer periphery thereof fit in the end opening of said housing to cover the end opening;

a connector disposed on said printed circuit board, said connector having an opposite pair of a first side face facing the first side wall of said housing and a second side face abutting said printed circuit board, said connector also having another opposite pair of a first end exposed through the aperture of said cover outside said housing and a second end facing the end wall of said housing; and at least one protrusion formed on an inner face of the first side wall of said housing to enhance a rigidity of said housing, said at least one protrusion facing the first side face of said connector in a direction from the first side wall to the second side wall of said housing.

2. The electronic device as set forth in claim 1, wherein said at least one protrusion is so disposed that, when said connector is rotated around a portion of an inner circumference of said cover defining the aperture in a direction that the first end of said connector gets away from the first side wall of said housing, said at least one protrusion makes contact with said connector, thereby stopping the rotation of said connector.

3. The electronic device as set forth in claim 2, further comprising a bend provided in the first side wall of said housing to enhance the rigidity of said housing, the bend having an inner face at least a part of which faces the second end of said connector in a direction from the end wall to the end opening of said housing.

4. The electronic device as set forth in claim 3, wherein said bend is so disposed that, when said connector is rotated around a portion of an inner circumference of said cover defining the aperture in a direction that the first end of said connector gets closer to the first side wall of said housing, said bend makes contact with said connector, thereby stopping the rotation of said connector.

5. The electronic device as set forth in claim 4, further comprising a table on which a plate is to be attached, said table protruding outwardly from one of the first, second, third, and fourth side walls of said housing to enhance the rigidity of said housing.

6. The electronic device as set forth in claim 1, wherein a clearance is provided between said at least one protrusion and the first side face of said connector.

7. The electronic device as set forth in claim 1, wherein said at least one protrusion has an end face facing the end opening of said housing, the end face of said at least one protrusion being inclined with respect to the inner face of the first side wall of said housing such that a distance between the end face of said at least one protrusion and the inner face of the first side wall of said housing increases gradually in a direction from the end opening to the end wall of said housing.

8. The electronic device as set forth in claim 1, wherein said housing and said cover are fabricated from resin.

9. The electronic device as set forth in claim 1, wherein the electronic device is an electronic control unit for an engine of an automotive vehicle.

10. The electronic device as set forth in claim 1, further comprising a bend provided in the first side wall of said housing to enhance the rigidity of said housing, the bend having an inner face at least a part of which faces the second end of said connector in a direction from the end wall to the end opening of said housing.

11. The electronic device as set forth in claim 10, further comprising a table on which a plate is to be attached, said table protruding outwardly from one of the first, second, third, and fourth side walls of said housing to enhance the rigidity of said housing.

12. The electronic device as set forth in claim 1, further comprising a table on which a plate is to be attached, said table protruding outwardly from one of the first, second, third, and fourth side walls of said housing to enhance the rigidity of said housing.

13. An electronic device comprising:

a printed circuit board;

a housing in which said printed circuit board is accommodated, said housing having a first opposite pair of a first and a second side wall and a second opposite pair of a third and a fourth side wall, said housing also having an end wall and an end opening opposite to the end wall;

a cover having an aperture formed therein, said cover also having at least a portion of an outer periphery thereof fit in the end opening of said housing to cover the end opening;

a connector disposed on said printed circuit board, said connector having an opposite pair of a first side face facing the first side wall of said housing and a second side face abutting said printed circuit board, said connector also having another opposite pair of a first end exposed through the aperture of said cover outside said housing and a second end facing the end wall of said housing; and a bend provided in the first side wall of said housing to enhance a rigidity of said housing, the bend having an inner face at least a part of which faces the second end of said connector in a direction from the end wall to the end opening of said housing.

14. The electronic device as set forth in claim 13, wherein said bend is so disposed that, when said connector is rotated around a portion of an inner circumference of said cover defining the aperture in a direction that the first end of said connector gets closer to the first side wall of said housing, said bend makes contact with said connector, thereby stopping the rotation of said connector.

15. The electronic device as set forth in claim 13, wherein a clearance is provided between the inner face of said bend and the second end of said connector.

16. The electronic device as set forth in claim 13, wherein said bend has a width smaller than that of the end opening of said housing in a direction from the third side wall to the fourth side wall of said housing.

17. The electronic device as set forth in claim 13, wherein said housing and said cover are fabricated from resin.

18. The electronic device as set forth in claim 13, wherein the electronic device is an electronic control unit for an engine of an automotive vehicle.

19. The electronic device as set forth in claim 13, further comprising a table on which a plate is to be attached, said table protruding outwardly from one of the first, second, third, and fourth side walls of said housing to enhance the rigidity of said housing.

20. An electronic device comprising:

a printed circuit board;

a housing in which said printed circuit board is accommodated, said housing having a first opposite pair of a first and a second side wall and a second opposite pair of a third and a fourth side wall, said housing also having an end wall and an end opening opposite to the end wall;

a cover having an aperture formed therein, said cover also having at least a portion of an outer periphery thereof fit in the end opening of said housing to cover the end opening;

a connector disposed on said printed circuit board, said connector having an opposite pair of a first side face facing the first side wall of said housing and a second side face abutting said printed circuit board, said connector also having another opposite pair of a first end exposed through the aperture of said cover outside said housing and a second end facing the end wall of said housing; and a table on which a plate is to be attached, said table protruding outwardly from one of the first, second, third, and fourth side walls of said housing to enhance a rigidity of said housing.

21. The electronic device as set forth in claim 20, wherein the one of the first, second, third, and fourth side walls of said housing from which said table protrudes is the first side wall of said housing.

22. The electronic device as set forth in claim 20, wherein said housing and said cover are fabricated from resin.

23. The electronic device as set forth in claim 20, wherein the electronic device is an electronic control unit for an engine of an automotive vehicle.

24. A housing for use in an electronic device that comprises, when assembled, said housing, a printed circuit board accommodated in said housing, a cover having an aperture formed therein, and a connector disposed on said printed circuit board which has an opposite pair of a first end exposed through the aperture of said cover outside said housing and a second end, and another opposite pair of a first side face and a second side face abutting said printed circuit board, said housing comprising:

a first opposite pair of a first and a second side wall, a second opposite pair of a third and a fourth side wall, an end wall, and an end opening opposite to the end wall and designed to be covered by said cover, the first side wall and the end wall of said housing being arranged to face, when said electronic device is assembled, the first side face and the second end of said connector respectively;

at least one protrusion formed on an inner face of the first side wall of said housing to enhance a rigidity of said housing, said at least one protrusion being disposed to face, when said electronic device is assembled, the first side face of said connector in a direction from the first side wall to the second side wall of said housing;

a bend provided in the first side wall of said housing to enhance the rigidity of said housing, the bend having an inner face at least a part of which is to face, when said electronic device is assembled, the second end of said connector in a direction from the end wall to the end opening of said housing; and a table on which a plate is to be attached, said table protruding outwardly from one of the first, second, third, and fourth side walls of said housing to enhance the rigidity of said housing.

25. The housing as set forth in claim 24, wherein said at least one protrusion is so disposed that, when said connector is, upon assembly of said electronic device, rotated around a portion of an inner circumference of said cover defining the aperture in a direction that the first end of said connector gets away from the first side wall of said housing, said at least one protrusion is to make contact with said connector, thereby stopping the rotation of said connector.

26. The housing as set forth in claim 24, wherein said bend is so disposed that, when said connector is, upon assembly of said electronic device, rotated around a portion of an inner circumference of said cover defining the aperture in a direction that the first end of said connector gets closer to the first side wall of said housing, said bend is to make contact with said connector, thereby stopping the rotation of said connector.

* * * * *